US007028123B2

(12) United States Patent
Shimomura

(10) Patent No.: US 7,028,123 B2
(45) Date of Patent: Apr. 11, 2006

(54) MICROCOMPUTER, HAS SELECTION CIRCUIT TO SELECT EITHER TESTING-PURPOSE INTERRUPT REQUEST SIGNAL OR INTERRUPT REQUEST SELECTION SIGNAL BASED ON DELAYED SELECTION SIGNAL, WHERE SELECTED SIGNALS ARE SENT TO INTERRUPT CONTROLLER

(75) Inventor: Takehiko Shimomura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 356 days.

(21) Appl. No.: 10/411,222

(22) Filed: Apr. 11, 2003

(65) Prior Publication Data

US 2004/0088461 A1   May 6, 2004

(30) Foreign Application Priority Data

Nov. 6, 2002   (JP) .............................. 2002-322320

(51) Int. Cl.
*G06F 13/24* (2006.01)

(52) U.S. Cl. ........................ 710/260; 710/268; 710/48; 710/22

(58) Field of Classification Search ........ 710/260–269, 710/48–51, 22–24
See application file for complete search history.

(56) References Cited

U.S. PATENT DOCUMENTS 5,471,620 A * 11/1995 Shimizu et al. ............. 710/265
5,754,866 A * 5/1998 Priem .......................... 710/260
5,790,872 A * 8/1998 Nozue et al. ................ 710/267
5,862,389 A * 1/1999 Kardach et al. ............. 710/266
6,279,067 B1 * 8/2001 Callway et al. ............. 710/260
6,502,152 B1 * 12/2002 Laurenti ...................... 710/264
6,539,448 B1 * 3/2003 Deng .......................... 710/260
6,581,119 B1 * 6/2003 Maeda et al. ............... 710/260
6,721,878 B1 * 4/2004 Paul et al. ................... 712/244
6,725,309 B1 * 4/2004 Kim ........................... 710/260

FOREIGN PATENT DOCUMENTS

JP            63-286938          11/1988

* cited by examiner

*Primary Examiner*—Rehana Perveen
*Assistant Examiner*—Raymond N Phan
(74) *Attorney, Agent, or Firm*—Buchanan Ingersoll PC

(57) ABSTRACT

In a microcomputer, a testing-purpose interrupt request signal generator generates a testing-purpose interrupt request signal, an interrupt request selecting register stores an interrupt request selection signal for making an interrupt request during testing effective, and at least one delay circuit generates one or more delayed interrupt request selection signals obtained by delaying the interrupt request selection signal by one or more delay times. Each of selection circuits selects either one of the interrupt request signals or the testing-purpose interrupt request signal based on the delayed interrupt request selection signal. The testing-purpose interrupt request signals output from the respective selection circuits at a different timing, can be sequentially input to the interrupt controller.

6 Claims, 6 Drawing Sheets

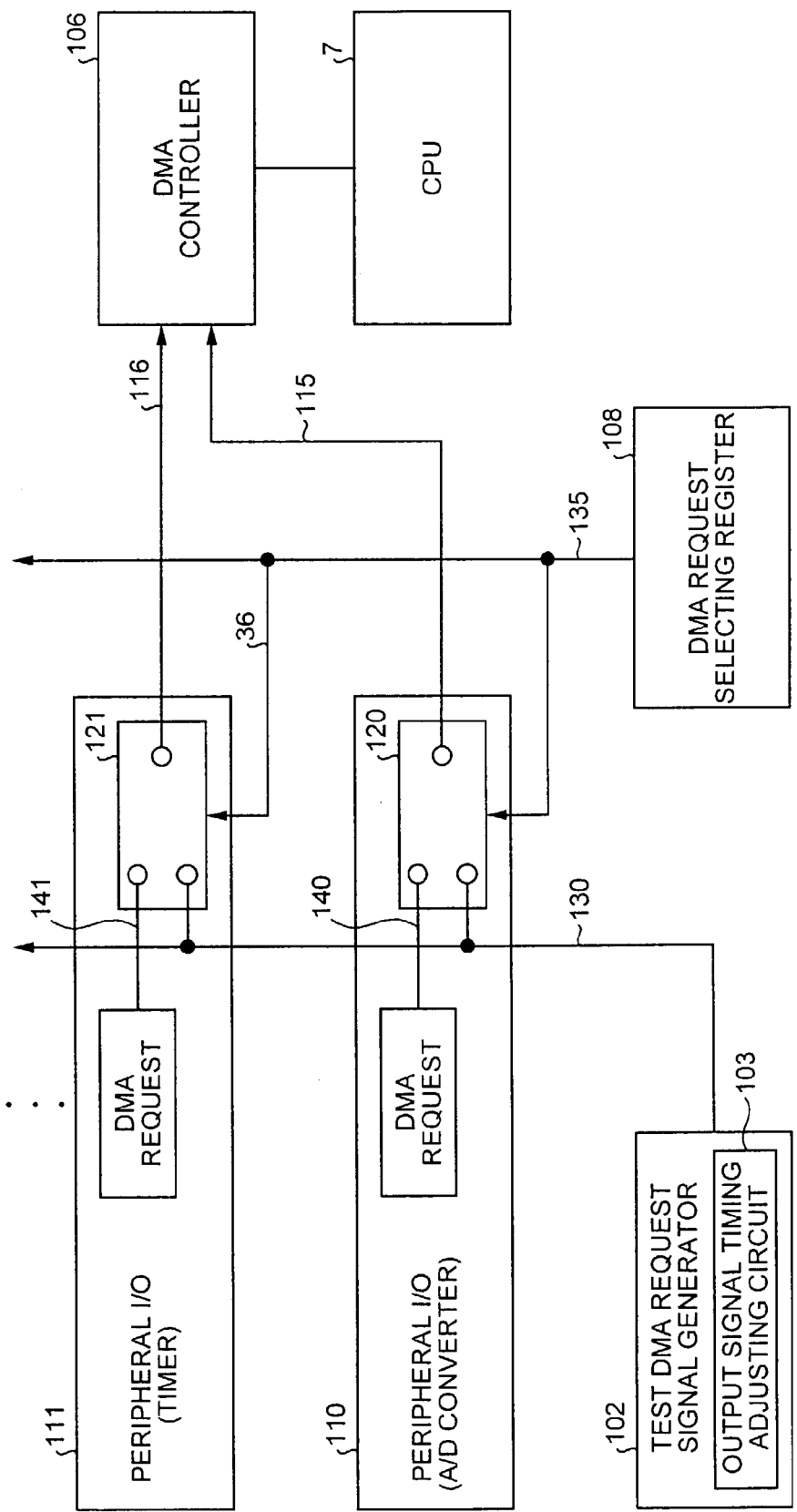

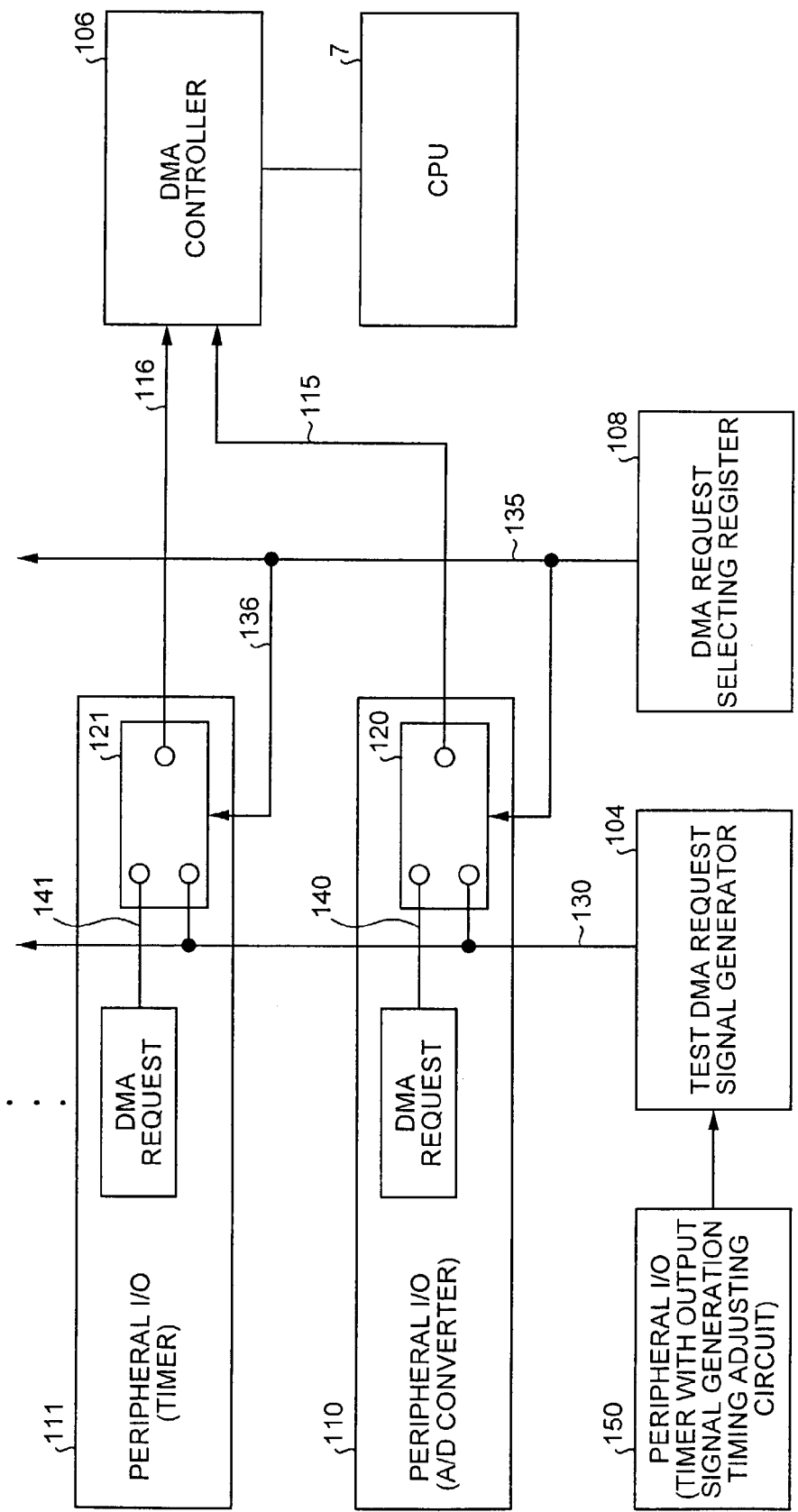

MICROCOMPUTER, HAS SELECTION CIRCUIT TO SELECT EITHER TESTING-PURPOSE INTERRUPT REQUEST SIGNAL OR INTERRUPT REQUEST SELECTION SIGNAL BASED ON DELAYED SELECTION SIGNAL, WHERE SELECTED SIGNALS ARE SENT TO INTERRUPT CONTROLLER

BACKGROUND OF THE INVENTION

1) Field of the Invention

The present invention relates to a microcomputer configured to facilitate a test on an interrupt request signal and a direct memory access (DMA) request signal issued from peripheral inputs/outputs (I/Os) built in the microcomputer.

2) Description of the Related Art

In a conventional microcomputer, peripheral I/Os such as a timer and an analog-to-digital (A/D) converter, an interrupt controller, a central processing unit (CPU), and the like are integrated on one chip, and a test on an interrupt request signal from the peripheral I/Os is conducted in the following manner.

That is, according to a conventional method of conducting a test on interrupt request signals, performed in a microcomputer, the test is conducted on an interrupt function of the CPU based on an interrupt request signal by giving conditions that allow an interrupt request to be generated in each of the peripheral I/Os, to the peripheral I/O, and actually operating the peripheral I/O to output the interrupt request signal from the peripheral I/O to the interrupt controller.

When inter-wiring short-circuiting between the interrupt request signals is to be detected, one peripheral I/O is allowed to actually generate an interrupt request signal, and it is confirmed that an interrupt request signal is not generated in any other peripheral I/O.

At the time of conducing a test for checking whether generation of the interrupt request signal in each peripheral I/O and the interrupt request confirmation signal from the CPU occur at the same timing, an appropriate test pattern is provided to each peripheral I/O to monitor the internal signal by simulation or the like.

In such a conventional technique, an appropriate test pattern is provided to create a situation for generating an interrupt request signal by the peripheral I/O, and the interrupt request signal is actually generated by each peripheral I/O, to carry out a test on inter-wiring short-circuiting between the interrupt request signals and the interrupt function such as simultaneous generation of interrupt request signals from a plurality of peripheral I/Os. Therefore, it is necessary to perform troublesome operation such as creating a test pattern, and there is a problem that the interrupt function test cannot be carried out efficiently.

SUMMARY OF THE INVENTION

It is an object of this invention to provide a microcomputer that facilitates a test on an interrupt request signal and a DMA request signal from peripheral I/Os built in a microcomputer, thereby enabling an efficient test.

The microcomputer according to one aspect of this invention includes a plurality of peripheral inputs and outputs (I/Os) that generate interrupt request signals, an interrupt controller that controls selection of the interrupt request signals from the peripheral I/Os, and a central processing unit that performs interrupt processing by using the interrupt request signal selected by the interrupt controller. The microcomputer also includes an interrupt request signal generator that generates a testing-purpose interrupt request signal, an interrupt request selecting register that stores an interrupt request selection signal for making an interrupt request during testing effective, and at least one delay circuit that generates one or more delayed interrupt request selection signals, obtained by delaying the interrupt request selection signal from the interrupt request selecting register by one or more delay times. The microcomputer further includes a plurality of selection circuits each of which selects either one of the interrupt request signals from the peripheral I/Os and the testing-purpose interrupt request signal from the interrupt request signal generator, based on the delayed interrupt request selection signal from the delay circuit. The testing-purpose interrupt request signals output from the selection circuits respectively at a different timing can be sequentially input to the interrupt controller.

The microcomputer according to another aspect of this invention includes a plurality of peripheral inputs and outputs (I/Os) that generate interrupt request signals, an interrupt controller that controls selection of the interrupt request signals from the peripheral I/Os, and a central processing unit that performs interrupt processing by using the interrupt request signal selected by the interrupt controller. The microcomputer also includes an interrupt request signal generator that generates a testing-purpose interrupt request signal whose generation timing is adjustable, and an interrupt request selecting register that stores an interrupt request selection signal for making an interrupt request during testing effective. The microcomputer further includes a plurality of selection circuits each of which selects either one of the interrupt request signals from the peripheral I/Os or the testing-purpose interrupt request signal from the interrupt request signal generator, based on the interrupt request selection signal from the interrupt request selecting register. The testing-purpose interrupt request signals output from the selection circuits can be input to the interrupt controller.

The microcomputer according to a still another aspect of this invention includes a plurality of peripheral inputs and outputs (I/Os) that generate direct memory access (DMA) request signals, a DMA controller that executes DMA processing based on the DMA request signals from the peripheral I/Os, and a central processing unit. The microcomputer also includes a DMA request signal generator that generates a testing-purpose DMA request signal, a DMA request selecting register that stores a DMA request selection signal for making a DMA request during testing effective, and at least one delay circuit that generates one or more delayed DMA request selection signals, obtained by delaying the DMA request selection signal from the DMA request selecting register by one or more delay times. The microcomputer further includes a plurality of selection circuits each of which selects either one of the DMA request signals from the peripheral I/Os or the testing-purpose DMA request signal from the DMA request signal generator, based on the one or more delayed DMA request selection signal from the delay circuit. The testing-purpose DMA request signal output from the one or more selection circuits respectively at a different timing can be sequentially input to the DMA controller.

The microcomputer according to a still another aspect of this invention includes a plurality of peripheral inputs and outputs (I/Os) that generate direct memory access (DMA) request signals, a DMA controller that executes DMA processing based on the DMA request signals from the peripheral I/Os, and a central processing unit. The microcomputer also includes a DMA request signal generator that generates a testing-purpose DMA request signal whose generation timing is adjustable, and a DMA request selecting register that stores a DMA request selection signal for making a DMA request during testing effective. The microcomputer further includes a plurality of selection circuits each of which selects either one of the DMA request signals from the peripheral I/Os or the testing-purpose DMA request signal from the DMA request signal generator, based on the DMA request selection signal from the DMA request selecting register. The testing-purpose DMA request signal output from the selection circuits can be input to the DMA controller.

These and other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 5 shows a block diagram of the configuration of a microcomputer according to a fifth embodiment of this invention, and FIG. 6 shows a block diagram of the configuration of a microcomputer according to a sixth embodiment of this invention.

DETAILED DESCRIPTION

Embodiments of the microcomputer according to the present invention will be explained in detail with reference to the drawings.

Figure 1:
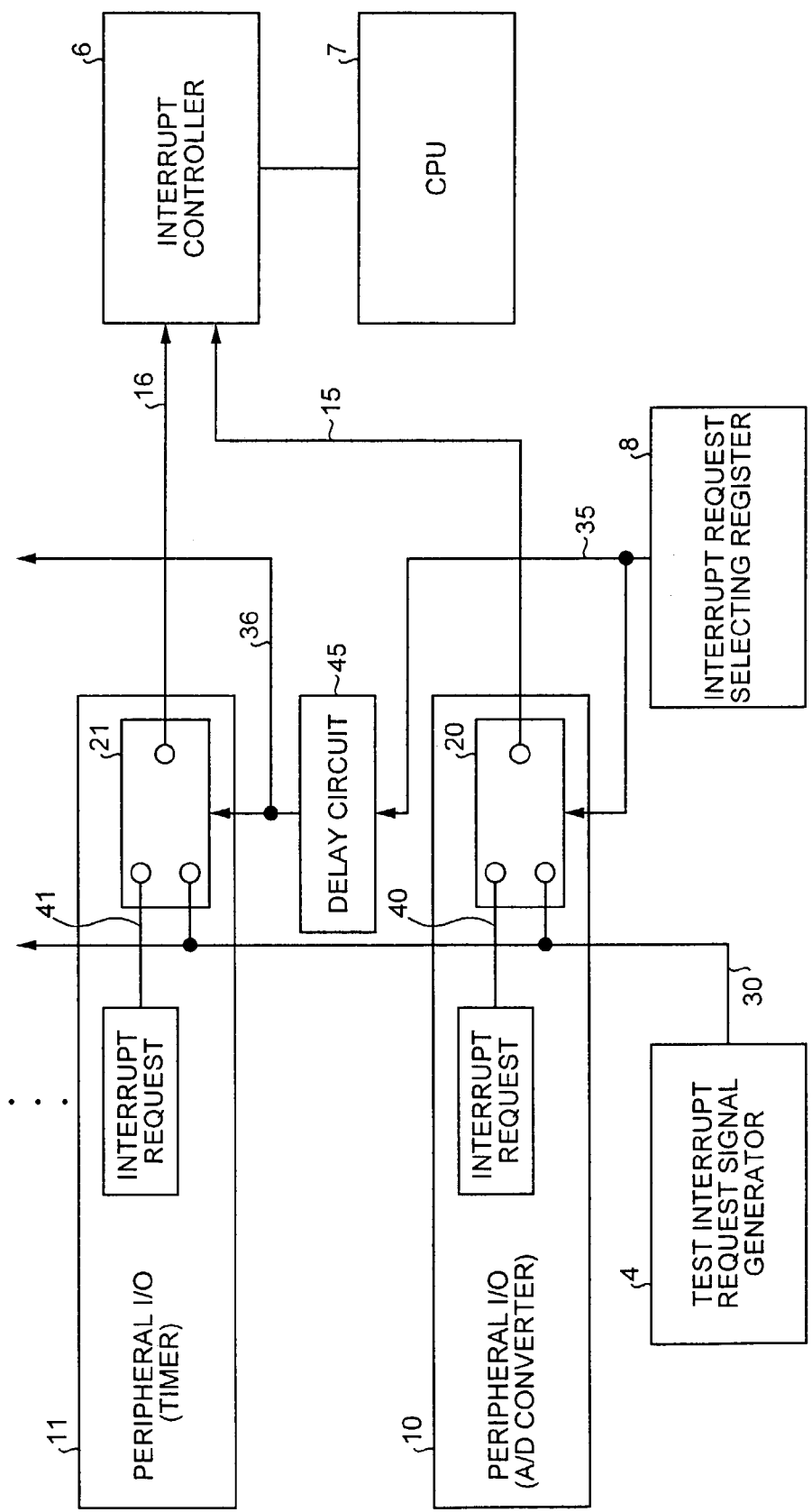
FIG. 1 shows a block diagram of the configuration of a microcomputer according to a first embodiment of this invention.

A first embodiment of the present invention will be explained below with reference to FIG. 1. FIG. 1 shows the components of a test circuit of peripheral I/Os built in the microcomputer of the present invention.

As shown in FIG. 1, the microcomputer comprises a CPU 7, an interrupt controller (ICU) 6, as well as a plurality of peripheral I/Os (peripheral input-output unit) including 10 and 11. The interrupt controller 6 receives interrupt request signals input from the peripheral I/Os 10 and 11, specifies an interrupt signal having the highest priority among these, and transmits an interrupt request signal (IRQ) corresponding the interrupt signal to the CPU 7. When receiving the interrupt request signal (IRQ) from the interrupt controller 6, the CPU 7 finishes a series of active processes, and thereafter, executes interrupt processing corresponding to the interrupt request.

The peripheral I/Os 10 and 11 generally include a timer, an analog-to-digital (A/D) converter, a digital-to-analog (D/A) converter, and a pulse width modulator. In this case, the A/D converter and the timer are indicated as the peripheral I/Os 10 and 11.

An interrupt request signal generator for testing purpose ("testing-purpose interrupt request signal generator") 4 artificially generates an interrupt request signal, and outputs the generated interrupt request signal for testing purpose ("testing-purpose interrupt request signal") 30 to selection circuits including 20 and 21. The signal generator 4 comprises, for example, a 1-bit register.

The selection circuits 20 and 21 are built in respective peripheral I/Os 10 and 11. The testing-purpose interrupt request signal 30 from the testing-purpose interrupt request signal generator 4 and an interrupt request signal 40 from the peripheral I/O (A/D converter) 10 are input to the selection circuit 20. The testing-purpose interrupt request signal 30 from the signal generator 4 and an interrupt request signal 41 from the peripheral I/O (timer) 11 are input to the selection circuit 21.

An interrupt request selecting register 8 stores an interrupt request selection signal (in this case, 1-bit signal) externally input, for making an interrupt request during testing effective.

An interrupt request selection signal 35 output from the interrupt request selecting register 8 is input to the selection circuit 20 and a delay circuit 45. The output 36 of the delay circuit 45 is input to the selection circuit 21 and a delay circuit on the next stage (not shown). In this case, a plurality of delay circuits 45 subordinately connected constitute a shift register, and in each stage of the shift register, a delayed interrupt request selection signal 36 is formed, with the output timing of the input interrupt request selection signal 35 being delayed, for example, by one clock, and the formed delayed interrupt request selection signal 36 is input to the selection circuit 21.

As the configuration for delaying the interrupt request selection signal 35, not only the shift register but also any other optional circuit configurations may be employed if it can consequentially generate a plurality of delayed interrupt request selection signals, obtained by respectively delaying the interrupt request selection signal 35 by different delay time. Further, a signal obtained by delaying the interrupt request selection signal 35 may be input to the selection circuit 20.

The selection circuit 20 selects the interrupt request signal 40 from the peripheral I/O (A/D converter) 10 when the interrupt request selection signal 35 from the interrupt request selecting register 8 is 0, or selects the testing-purpose interrupt request signal 30 from the testing-purpose interrupt request signal generator 4 when the interrupt request selection signal 35 is 1, and outputs the selected signal to the interrupt controller 6.

The selection circuit 21 selects the interrupt request signal 41 from the peripheral I/O (timer) 11 when the delayed interrupt request selection signal 36 from the delay circuit 45 is 0, or selects the testing-purpose interrupt request signal 30 from the testing-purpose interrupt request signal generator 4 when the delayed interrupt request selection signal 36 is 1, and outputs the selected signal to the interrupt controller 6. Other selection circuits (not shown) operate in the same manner as explained above.

When the interrupt request selection signal 35 becomes 1, the interrupt request selection signals 35 and the delayed interrupt request selection signals 36, respectively input to the selection circuits 20 and 21, rise to 1 at a respectively different timing. Therefore, when the interrupt request selection signal 35 becomes 1, each of the selection circuits 20 and 21 selects the testing-purpose interrupt request signal 30 from the testing-purpose interrupt request signal generator 4, but the selection timing is different at each of the selection circuits 20 and 21. As a result, the signal line rising timing of the testing-purpose interrupt request signals 15 and 16 output to the signal lines 15 and 16 from the selection circuits 20 and 21 to the interrupt controller 6 is respectively different.

The operation in the configuration according to FIG. 1 will be explained below. When the test is started, at first, the testing-purpose interrupt request signal 30 output from the testing-purpose interrupt request signal generator 4 is turned to 1, and the interrupt request selection signal 35 output from the interrupt request selecting register 8 is turned to 1. It is assumed herein that, by the operation of the delay circuit 45, the interrupt request selection signal 35 is first input to the selection circuit 20 and after predetermined delay time passes, the delayed interrupt request selection signal 36 is input to the next selection circuit 21, and further, after predetermined delay time passes, the interrupt request selection signal is input to the next selection circuit (not shown).

Since the interrupt request selection signal 35 output from the interrupt request selecting register 8 is turned to 1, each of the selection circuits 20, 21 selects the testing-purpose interrupt request signal 30 from the testing-purpose interrupt request signal generator 4. However, since the interrupt request selection signal 35 is first input to the selection circuit 20 in the peripheral I/O 10, the testing-purpose interrupt request signal 30 from the testing-purpose interrupt request signal generator 4 is first input to the interrupt controller 6 via the signal line 15 from the selection circuit 20 in the peripheral I/O 10. In this manner, since the testing-purpose interrupt request signal generated from the testing-purpose interrupt request signal generator 4 serves as the interrupt request signal output from the peripheral I/O 10, it is not necessary to operate the peripheral I/O 10 so as to generate an interrupt request.

Subsequently, after the interrupt request selection signal 35 is input to the selection circuit 20 in the peripheral I/O 10 and after the predetermined delay time passes, the delayed interrupt request selection signal 36 is input to the selection circuit 21 in the peripheral I/O 11 via the delay circuit 45. Therefore, the testing-purpose interrupt request signal 30 from the testing-purpose interrupt request signal generator 4 is input to the interrupt controller 6 via the signal line 16 from the selection circuit 21 in the peripheral I/O 11. In the same way, the testing-purpose interrupt request signal 30 from another peripheral I/O is sequentially input to the interrupt controller 6.

According to the first embodiment, the testing-purpose interrupt request signal 30 generated by the testing-purpose interrupt request signal generator 4 is sequentially input to the interrupt controller 6, to create the same condition that an interrupt request is sent from the peripheral I/O 10 or 11 to the interrupt controller 6. As a result, it is possible to simply carry out the test for selecting only one interrupt request from the peripheral I/O and confirming that no interrupt request is generated from another peripheral I/Os, without actually operating the peripheral I/Os 10 and 11. Therefore, it becomes possible to easily perform the test for detecting whether the inter-wiring short-circuiting occurs between the interrupt request signal lines 15 and 16 provided between the peripheral I/O 10 or 11 and the interrupt controller 6. Further, according to the first embodiment, since the delay circuits 45 are used, the 1-bit interrupt request selecting register 8 can be used to sequentially output the testing-purpose interrupt request signal 30 to each of the interrupt request signal lines 15 and 16.

In the above explanation, at the time of carrying out the test, the interrupt request selection signal 35 is delayed by the delay circuits 45 to sequentially output the testing-purpose interrupt request signal 30 to each of interrupt request signal lines 15 and 16. However, the testing-purpose interrupt request signal 30 itself may be delayed by a plurality of different time by delay circuits and input to each selection circuit so as to achieve the same function as explained above. When the testing-purpose interrupt request signal 30 is delayed, the interrupt request selection signal output from the interrupt request selecting register 8 is input to each selection circuit without being delayed.

A second embodiment of this invention will be explained below with reference to FIG. 2. In the second embodiment, a testing-purpose interrupt request signal generator 2 can generate a testing-purpose interrupt request signal whose generation timing is adjustable by software.

Figure 2:
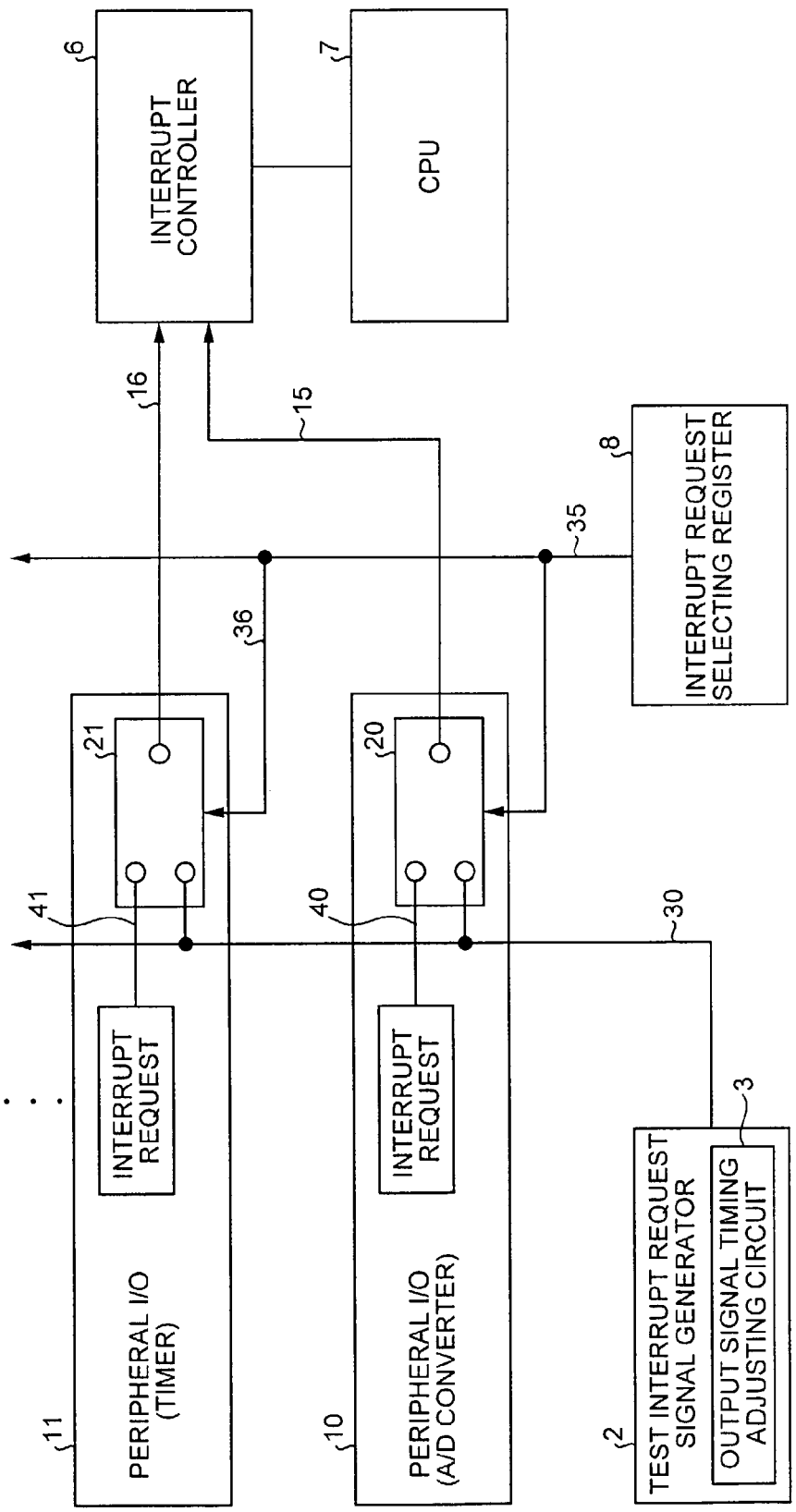
FIG. 2 shows a block diagram of the configuration of a microcomputer according to a second embodiment of this invention.

FIG. 2 shows a test circuit of peripheral I/Os built in the microcomputer of the present invention. The components in the microcomputer shown of FIG. 2 having the same function as those of FIG. 1 are denoted by the same reference numerals, and repeated explanation is omitted.

In FIG. 2, the interrupt request selecting register 8 stores an interrupt request selection signal 35 (in this case, 1-bit signal), for making an interrupt request during testing effective. This interrupt request selection signal 35 is directly input to each of the selection circuits 20 and 21 without being delayed.

A testing-purpose interrupt request signal generator 2 has an output signal timing adjusting circuit 3 that can adjust the generation timing of the testing-purpose interrupt request signal 30 by software. For example, when the testing-purpose interrupt request signal generator 2 is formed of a register that stores the testing-purpose interrupt request signal 30, the output signal timing adjusting circuit 3 can optionally set the delay time, by software, from a point in time when the testing-purpose interrupt request signal 30 is written in the register until the generation of the testing-purpose interrupt request signal 30.

According to the second embodiment, the testing-purpose interrupt request signals can be simultaneously output to the interrupt request signal lines 15 and 16 corresponding to the respective peripheral I/Os 10 and 11 without actually operating the peripheral I/Os 10 and 11, and the generation timing can be optionally and easily adjusted by software. As a result, a critical test on a request bit of the interrupt controller 6 can be facilitated, and therefore it is possible to easily perform a competitive test such that the interrupt controller 6 performs confirmation as to whether an interrupt request is generated from the interrupt request signal lines 15 and 16 and whether the interrupt request is issued from the CPU 7 at the same timing.

The configuration may be such that each of the selection circuits 20 and 21 can be selected independently by interrupt request selection signals of a plurality of bits from the interrupt request selecting register 8, or such that testing-purpose interrupt request signals of a plurality of bits are generated from the testing-purpose interrupt request signal generator 2, and these testing-purpose interrupt request signals may be input separately to each of the selection circuits 20 and 21.

A third embodiment of this invention will be explained below with reference to FIG. 3. In the third embodiment, adjustment of the output timing of a testing-purpose interrupt request signal is executed by applying peripheral I/Os such as a timer with an output timing adjusting circuit, built in the microcomputer.

Figure 3:
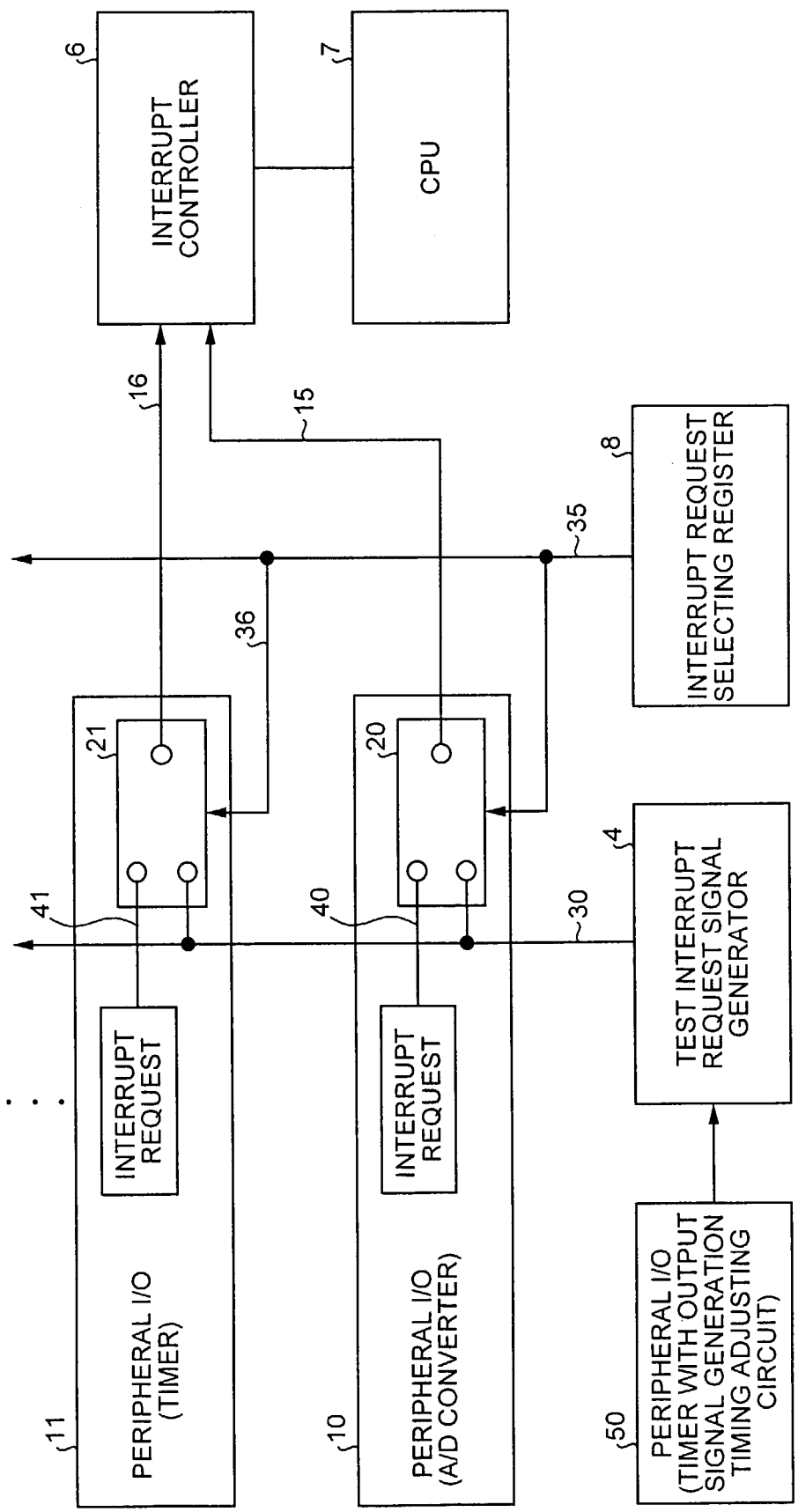
FIG. 3 shows a block diagram of the configuration of a microcomputer according to a third embodiment of this invention.

FIG. 3 shows a test circuit for peripheral I/Os built in the microcomputer of the present invention. The components of the microcomputer shown in FIG. 3 having the same function as those of FIG. 2 are denoted by the same reference numerals, and repeated explanation is omitted.

In this third embodiment, as the unit that adjusts the generation timing of the testing-purpose interrupt request signal 30, a timer 50 with an output signal timing adjusting circuit as a peripheral I/O is used instead of the output signal timing adjusting circuit 3 in FIG. 2. This timer 50 can adjust the generation timing of the testing-purpose interrupt request signal by software.

According to the third embodiment, the testing-purpose interrupt request signals can be simultaneously output to the interrupt request signal lines 15 and 16 corresponding to the respective peripheral I/Os 10 and 11 without actually operating the peripheral I/Os 10 and 11, and the generation timing can be optionally and easily adjusted by the software. As a result, a critical test on a request bit of the interrupt controller 6 can be performed easily, and therefore it is possible to easily perform a competitive test such that the interrupt controller 6 confirms generation of an interrupt request from the interrupt request signal lines 15 and 16 and issuing of an interrupt request from the CPU 7 at the same timing. Further, since the resource such as the timer with the output signal timing adjusting circuit built in the microcomputer is applied, it is advantageous that an increase in the circuit size can be prevented.

Figure 4:
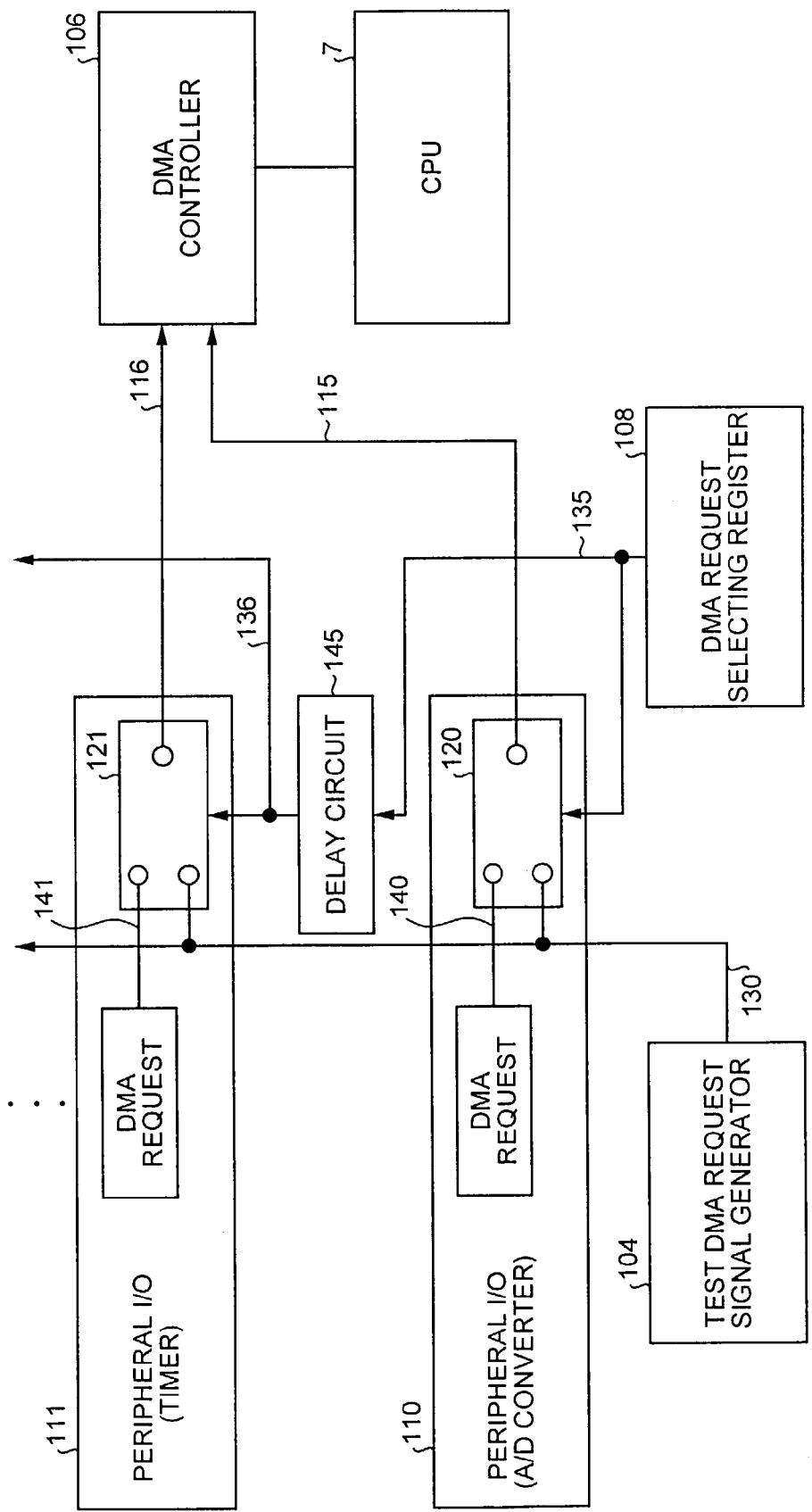
FIG. 4 shows a block diagram of the configuration of a microcomputer according to a fourth embodiment of this invention.

A fourth embodiment of this invention will be explained below with reference to FIG. 4. In the fourth embodiment, a test on a direct memory access (DMA) request signal of the peripheral I/O is carried out by using the configuration of the first embodiment shown in FIG. 1. DMA transfer is performed by carrying out data transfer, as well known, between each peripheral I/O in the microcomputer and a memory, not through the CPU 7, and a DAM controller 106 executes control for the DMA transfer based on a DMA request signal from a plurality of peripheral I/Os including 110 and 111.

A testing-purpose DMA request signal generator 104 artificially generates a DMA request signal, and outputs the generated testing-purpose DMA request signal 130 to selection circuits including 120 and 121.

The selection circuits 120 and 121 are built in the peripheral I/Os 110 and 111, respectively. The testing-purpose DMA request signal 130 from the testing-purpose DMA request signal generator 104 and a DMA request signal 140 from the peripheral I/O (A/D converter) 110 are input to the selection circuit 120. The testing-purpose DMA request signal 130 from the testing-purpose DMA request signal generator 104 and a DMA request signal 141 from the peripheral I/O (timer) 111 are input to the selection circuit 121.

A DMA request selecting register 108 stores a DMA request selection signal (in this case, 1-bit signal) externally input, for making a DMA request during testing effective.

The DMA request selection signal 135 output from the DMA request selecting register 108 is input to the selection circuit 120 and a delay circuit 145. The output 136 of the delay circuit 145 is input to the selection circuit 121 and a delay circuit on the next stage (not shown).

The selection circuit 120 selects the DMA request signal 140 from the peripheral I/O (A/D converter) 110 when the DMA request selection signal 135 from the DMA request selecting register 108 is 0, or selects the testing-purpose DMA request signal 130 from the testing-purpose DMA request signal generator 104 when the DMA request selection signal 135 is 1, and outputs the selected signal to the DMA controller 106.

The selection circuit 121 selects the DMA request signal 141 from the peripheral I/O (timer) 111 when the delayed DMA request selection signal 136 from a delay circuit 145 is 0, or selects the testing-purpose DMA request signal 130 from the testing-purpose DMA request signal generator 104 when the delayed DMA request selection signal 136 is 1, and outputs the selected signal to the DMA controller 106.

In the fourth embodiment, the interrupt request is replaced with the DMA request, but the operation thereof is basically entirely the same as the operation in the first embodiment, and hence repeated explanation is omitted. According to the fourth embodiment, the testing-purpose DMA request signal 130 generated by the testing-purpose DMA request signal generator 104 is sequentially input to the DMA controller 106, to create the same condition that a DMA request is sent from the peripheral I/O 110 or 111 to the DMA controller 106. As a result, it is possible to simply and easily carry out a test for selecting only one DMA request from the peripheral I/O and confirming that no DMA request is generated from any other peripheral I/Os, without actually operating the peripheral I/Os 110 and 111. Therefore, it is possible to easily carry out a test for detecting whether inter-wiring short-circuiting occurs between the DMA request signal lines 115 and 116 provided between the peripheral I/O 110 or 111 and the DMA controller 106.

A fifth embodiment of this invention will be explained below with reference to FIG. 5. In the fifth embodiment, a test on a DMA request signal of the peripheral I/O is carried out using the configuration of the second embodiment shown in FIG. 2.

A testing-purpose DMA request signal generator 102 has an output signal timing adjusting circuit 103 that can adjust the generation timing of the testing-purpose DMA request signal 130 by software.

According to the fifth embodiment, the testing-purpose DMA request signals can be simultaneously output to the DMA request signal lines 115 and 116 corresponding to the respective peripheral I/Os 110 and 111 without actually operating the peripheral I/Os 110 and 111, and the generation timing can be optionally and easily adjusted by the software. Therefore, a critical test on a request bit of the DMA controller 106 becomes easy, and it is possible to easily perform a competitive test such that the DMA controller 106 confirms the generation of a DMA request from the DMA request signal lines 115 and 116 and the DMA request from the CPU 7 at the same timing.

A sixth embodiment of this invention will be explained below with reference to FIG. 6. In the sixth embodiment, a test on a DMA request signal of the peripheral I/O is carried out, using the configuration of the third embodiment shown in FIG. 3.

In the sixth embodiment, as a unit that adjusts the generation timing of the testing-purpose DMA request signal 130, a timer with an output signal timing adjusting circuit 150 as a peripheral I/O is used instead of the output signal timing adjusting circuit 103 in FIG. 5. According to the sixth embodiment, it is advantageous that an increase in the circuit size can be prevented in addition to the advantageous effect of the fifth embodiment.

According to this invention, one or more delayed interrupt request selection signals is generated by the delay circuit, in which the interrupt request selection signal for making the interrupt request during testing effective is delayed by one or more delay times to generate one or more delayed interrupt request selection signals, so that the output timing of test-purposing interrupt request signals artificially generated by these delayed interrupt request selection signals, to the interrupt controller is shifted. As a result, it becomes possible to easily and efficiently carry out a test for confirming that only one interrupt request is selected and an interrupt request from another peripheral I/O does not occur. Accordingly, a test for detecting whether inter-wiring short-circuiting in interrupt request signal lines is detected can be carried out conveniently and efficiently.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A microcomputer comprising:
a plurality of peripheral inputs and outputs (I/Os) that generate interrupt request signals;
an interrupt controller that controls selection of the interrupt request signals from the peripheral I/Os;
a central processing unit that performs interrupt processing by using one of the interrupt request signals selected by the interrupt controller;
an interrupt request signal generator that generates a testing-purpose interrupt request signal whose generation timing is adjustable;
an interrupt request selecting register that stores an interrupt request selection signal, for making an interrupt request during testing effective; and
a plurality of selection circuits each of which selects either one of the interrupt request signals from the peripheral I/Os or the testing-purpose interrupt request signal from the interrupt request signal generator, based on the interrupt request selection signal from the interrupt request selecting register, wherein
the testing-purpose interrupt request signals output from the selection circuits can be input to the interrupt controller, wherein the interrupt request signal generator adjusts the generation timing of the testing-purpose interrupt request signal by software.

2. A microcomputer comprising:
a plurality of peripheral inputs and outputs (I/Os) that generate interrupt request signals;
an interrupt controller that controls selection of the interrupt request signals from the peripheral I/Os;
a central processing unit that performs interrupt processing by using one of the interrupt request signals selected by the interrupt controller;
an interrupt request signal generator that generates a testing-purpose interrupt request signal whose generation timing is adjustable;
an interrupt request selecting register that stores an interrupt request selection signal, for making an interrupt request during testing effective; and
a plurality of selection circuits each of which selects either one of the interrupt request signals from the peripheral I/Os or the testing-purpose interrupt request signal from the interrupt request signal generator, based on the interrupt request selection signal from the interrupt request selecting register, wherein
the testing-purpose interrupt request signals output from the selection circuits can be input to the interrupt controller, wherein a peripheral I/O having a timer function built in the microcomputer is connected to the interrupt request signal generator, and the interrupt request signal generator adjusts the generation timing of the testing-purpose interrupt request signal based on the signal of the peripheral I/O.

3. A microcomputer comprising:
a plurality of peripheral inputs and outputs (I/Os) that generate direct memory access (DMA) request signals;
a DMA controller that executes DMA processing based on the DMA request signals from the peripheral I/Os;
a central processing unit;
a DMA request signal generator that generates a testing-purpose DMA request signal;
a DMA request selecting register that stores a DMA request selection signal, for making a DMA request during testing effective;
at least one delay circuit that generates one or more delayed DMA request selection signals, obtained by delaying the DMA request selection signal from the DMA request selecting register by one or more delay times; and
a plurality of selection circuits each of which selects either one of the DMA request signals from the peripheral I/Os or the testing-purpose DMA request signal from the DMA request signal generator, based on the one or more delayed DMA request selection signals from the delay circuit, wherein
the testing-purpose DMA request signal output from the one or more selection circuits respectively at a different timing can be sequentially input to the DMA controller.

4. A microcomputer comprising:
a plurality of peripheral inputs and outputs (I/Os) that generate direct memory access (DMA) request signals;
a DMA controller that executes DMA processing based on the DMA request signals from the peripheral I/Os;
a central processing unit;
a DMA request signal generator that generates a testing-purpose DMA request signal whose generation timing is adjustable;
a DMA request selecting register that stores a DMA request selection signal, for making a DMA request during testing effective; and
a plurality of selection circuits each of which selects either one of the DMA request signals from the peripheral I/Os or the testing-purpose DMA request signal from the DMA request signal generator, based on the DMA request selection signal from the DMA request selecting register, wherein
the testing-purpose DMA request signals output from the selection circuits can be input to the DMA controller.

5. The microcomputer according to claim 4, wherein the DMA request signal generator adjusts the generation timing of the testing-purpose DMA request signal by software.

6. The microcomputer according to claim 4, wherein a peripheral I/O having a timer function built in the microcomputer is connected to the DMA request signal generator, and the DMA request signal generator adjusts the generation timing of the testing-purpose DMA request signal based on the signal of the peripheral I/O.

* * * * *